(12) United States Patent
Lee et al.

(10) Patent No.: US 9,596,775 B2
(45) Date of Patent: Mar. 14, 2017

(54) BUFFER MODULE AND PORTABLE ELECTRONIC DEVICE USING THE SAME

(71) Applicant: Wistron Corporation, New Taipei (TW)

(72) Inventors: Chia-Ching Lee, New Taipei (TW); Ta-Chun Hsiung, New Taipei (TW); Min-Hao Tang, New Taipei (TW); Jhih-Ming Chen, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 51 days.

(21) Appl. No.: 14/281,961

(22) Filed: May 20, 2014

(65) Prior Publication Data

US 2015/0201510 A1    Jul. 16, 2015

(30) Foreign Application Priority Data

Jan. 15, 2014    (TW) .............................. 103200814 U

(51) Int. Cl.
  *H05K 5/02*    (2006.01)
  *G06F 1/16*    (2006.01)
  *F16F 9/04*    (2006.01)
  *G06F 1/18*    (2006.01)

(52) U.S. Cl.
  CPC ......... *H05K 5/0234* (2013.01); *F16F 9/0481* (2013.01); *G06F 1/1616* (2013.01); *G06F 1/1626* (2013.01); *G06F 1/1656* (2013.01); *G06F 1/182* (2013.01); *G06F 2200/1633* (2013.01)

(58) Field of Classification Search
  USPC ................................ 361/679.55; 267/140.11
  IPC .................. F16F 9/0481; H05K 5/0234; G06F 1/1616,1/1626, 1/1656, 1/182, 2200/1633
  See application file for complete search history.

(56) References Cited

U.S. PATENT DOCUMENTS

| 2007/0283941 | A1* | 12/2007 | Tai ........................ F41B 11/642 124/67 |
| 2008/0260592 | A1* | 10/2008 | Yang ..................... B01L 3/0224 422/400 |
| 2014/0261177 | A1* | 9/2014 | Rasheed ............. C23C 14/0063 118/720 |

FOREIGN PATENT DOCUMENTS

TW    M335773    7/2008

OTHER PUBLICATIONS

English Abstract translation of TWM335773 (Published Jul. 1, 2008).

* cited by examiner

*Primary Examiner* — Hrayr A Sayadian
(74) *Attorney, Agent, or Firm* — McClure, Qualey & Rodack, LLP

(57) ABSTRACT

A buffer module and a portable electronic device using the same are provided. The buffer module comprises a buffer component and a base. The buffer component comprises a protrusion. The base has a gas vent and a buffer recess corresponding to the protrusion.

8 Claims, 3 Drawing Sheets

BUFFER MODULE AND PORTABLE ELECTRONIC DEVICE USING THE SAME

This application claims the benefit of Taiwan application Serial No. 103200814, filed Jan. 15, 2014, the subject matter of which is incorporated herein by reference.

BACKGROUND OF THE INVENTION

Field of the Invention

The invention relates in general to a buffer module and a portable electronic device using the same, and more particularly to a buffer module having a buffer recess and a portable electronic device using the same.

Description of the Related Art

Due to the development and advance in the manufacturing process of semiconductor, electronic elements are getting smaller and smaller, and portable electronic devices are getting more and more popular. However, when the portable electronic devices accidentally fall to the ground or hit the desktop, the portable electronic devices may receive a huge impact and become damaged.

SUMMARY OF THE INVENTION

The invention is directed to a buffer module and a portable electronic device using the same for resolving the problem of the portable electronic device being damaged when receiving a huge impact.

According to one embodiment of the present invention, a buffer module is provided. The buffer module comprises a buffer component and a base. The buffer component comprises a protrusion. The base has a gas vent and a buffer recess corresponding to the protrusion.

According to another embodiment of the present invention, a portable electronic device is provided. The portable electronic device comprises a casing and a buffer module. The buffer module is disposed on the casing and comprises a buffer component and a base. The base has a gas vent and a buffer recess. The buffer component comprises a protrusion and a flexible arm. The protrusion is slidable relative to the buffer recess. The flexible arm is connected to the protrusion and has a terminal portion fixed on the base.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
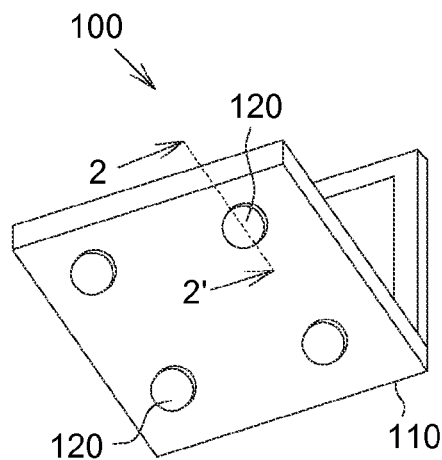
FIG. 1 is an appearance diagram of a portable electronic device according to an embodiment of the disclosure.

FIG. 1 is an appearance diagram of a portable electronic device according to an embodiment of the disclosure. The portable electronic device 100 may be realized by such as a notebook computer, a mobile phone, a personal digital assistant, a tablet PC, a satellite navigation device or other type of portable electronic device. The portable electronic device 100 comprises a casing 110 and a buffer module 120.

Figure 2:
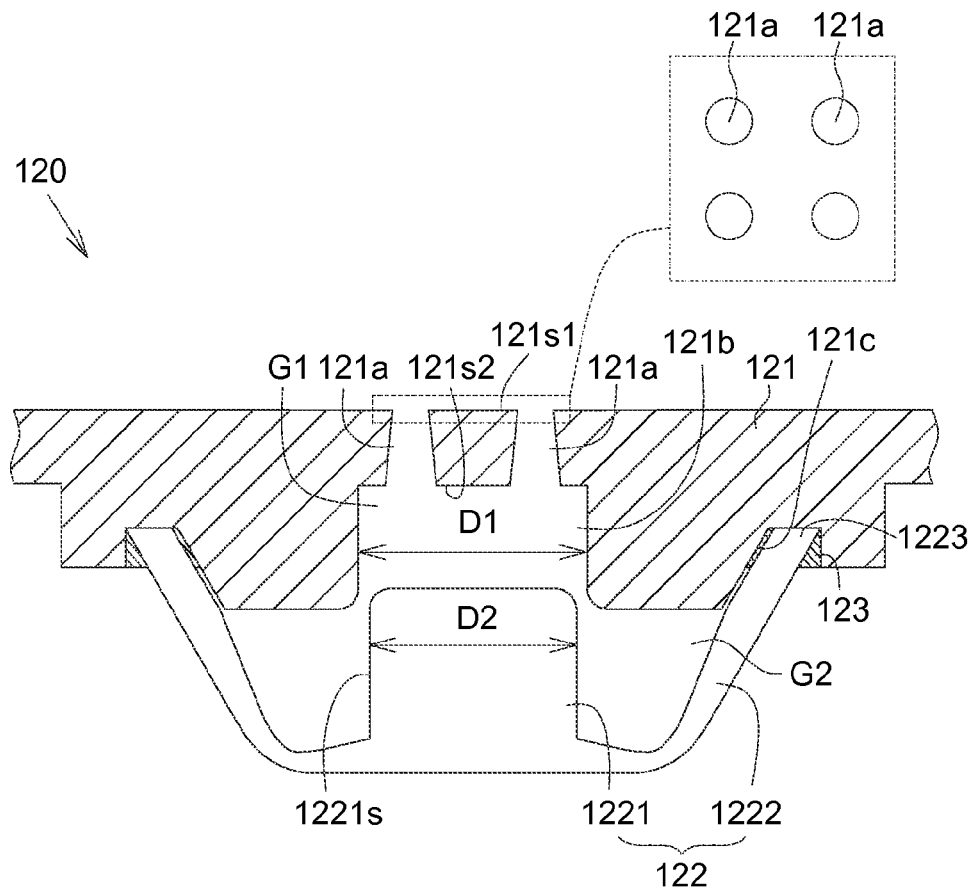
FIG. 2 is a cross-sectional view along a direction 2-2' of FIG. 1.

FIG. 2 is a cross-sectional view along a direction 2-2' of FIG. 1. The buffer module 120 comprises a base 121, a buffer component 122 and an adhesive 123.

In the present embodiment of the disclosure, the base 121 is a sub-element of the buffer module 120. In another embodiment, the base 121 may be a portion of the casing 110. The base 121 has an inner surface $121s1$, a gas vent $121a$ and a buffer recess $121b$ corresponding to the protrusion 1221 of the buffer component 122. The inner surface $121s1$ refers to a surface facing the interior of the casing 110. The gas vent $121a$ is vertically extended to the inner surface $121s1$ from the bottom surface $121s2$ of the buffer recess $121b$. In the present embodiment of the disclosure, the gas vent $121a$ is a conic hole. The conic hole has better manufacturing properties than the straight hole. As indicated in an enlargement of FIG. 2, a plurality of gas vents $121a$ are arranged in the form of an array, but the embodiments of the disclosure are not limited thereto. The number of gas vents $121a$ may be one or more than four as long as the venting area is large enough to provide a buffer function.

The buffer component 122 comprises a protrusion 1221 and a flexible arm 1222 connected to the protrusion 1221. In the present embodiment of the disclosure, the flexible arm 1222, such as a ring-shaped flexible arm, surrounds a lateral surface $1221s$ of the protrusion 1221 and has a terminal portion 1223 fixed on the base 121. The base 121 has a notch $121c$ inside which the terminal portion 1223 of the flexible arm 1222 is located. The adhesive 123 is located inside the notch $121c$ for bonding the terminal portion 1223 of the flexible arm 1222 to the interior of the notch $121c$, such that the terminal portion 1223 of the flexible arm 1222 becomes a fixing terminal, and the portion of the flexible arm 1222 other than the terminal portion 1223 is flexible (deformable) with respect to the protrusion 1221.

When the buffer component 122 is in a free state (that is, the buffer component 122 is not applied by any external forces), a first buffer gas chamber G1 is formed between the protrusion 1221 and a bottom surface $121s2$ of the buffer recess $121b$. The first buffer gas chamber G1 provides a buffer function to the buffer component 122 sliding in the buffer recess $121b$. In an embodiment, an inner diameter D1 of the buffer recess $121b$ is larger than an outer diameter D2 of the protrusion 1221. Thus, the protrusion 1221 of the buffer component 122 is slidable relative to the buffer recess $121b$. The flexible arm 1222 is extended to the exterior from a lateral surface $1221s$ of the protrusion 1221 in a direction towards the notch $121c$, such that a second buffer gas chamber G2 is formed between the protrusion 1221 and the flexible arm 1222. The second buffer gas chamber G2 provides a buffer function similar to that provided by the first buffer gas chamber G1.

Figure 3:
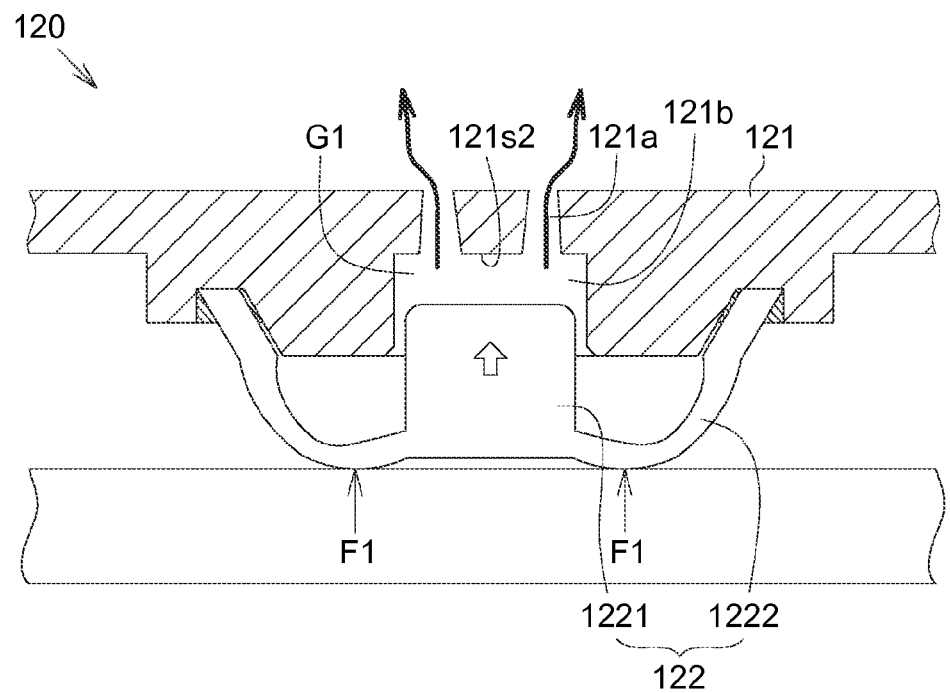
FIG. 3 is a cross-sectional view of a protrusion of FIG. 2 sliding relative to a bottom surface of a buffer recess.

FIG. 3 is a cross-sectional view of a protrusion of FIG. 2 sliding relative to a bottom surface of a buffer recess. When the portable electronic device 100 falls to the ground or a desktop, the buffer component 122 will receive a counter force F1 from the ground or the desktop and proceed towards the bottom surface $121s2$ of the buffer recess $121b$. During the proceeding process, the air inside the first buffer gas chamber G1 is pressed to provide a buffer function which avoids the elements inside the portable electronic device 100 being damaged by a huge impact. With the design of the gas vent $121a$, as the buffer component 122 slides towards the bottom surface 121s2 of the buffer recess 121b, partial air inside the first buffer gas chamber G1 will be vented to the exterior of the base 121 through the gas vent 121a, such that the resistance generated by the air pressed inside the first buffer gas chamber G1 may be reduced. Consequently, the buffer component 122 may continue to be deformed to absorb more impact energy.

Figure 4:
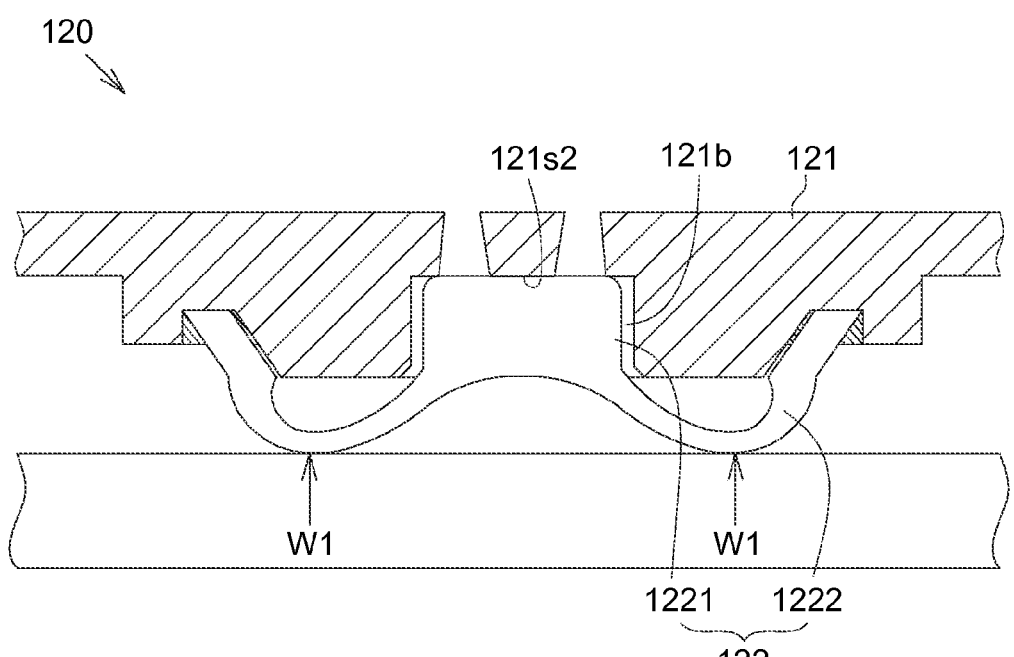
FIG. 4 is a cross-sectional view of a protrusion of FIG. 3 pressing on a bottom surface of a buffer recess.

FIG. 4 is a cross-sectional view of a protrusion of FIG. 3 pressing on a bottom surface of a buffer recess. After the portable electronic device 100 has contacted the ground or the desktop for a period of time, the buffer module 120 receives a counter act W1 from the portable electronic device 100, and the protrusion 1221 of the buffer component 122 directly leans on the bottom surface 121s2 of the buffer recess 121b. Thus, the relative position between the protrusion 1221 and the base 121 may be fixed, and the wobbling between the buffer component 122 and the base 121 may be mitigated.

Figure 5:
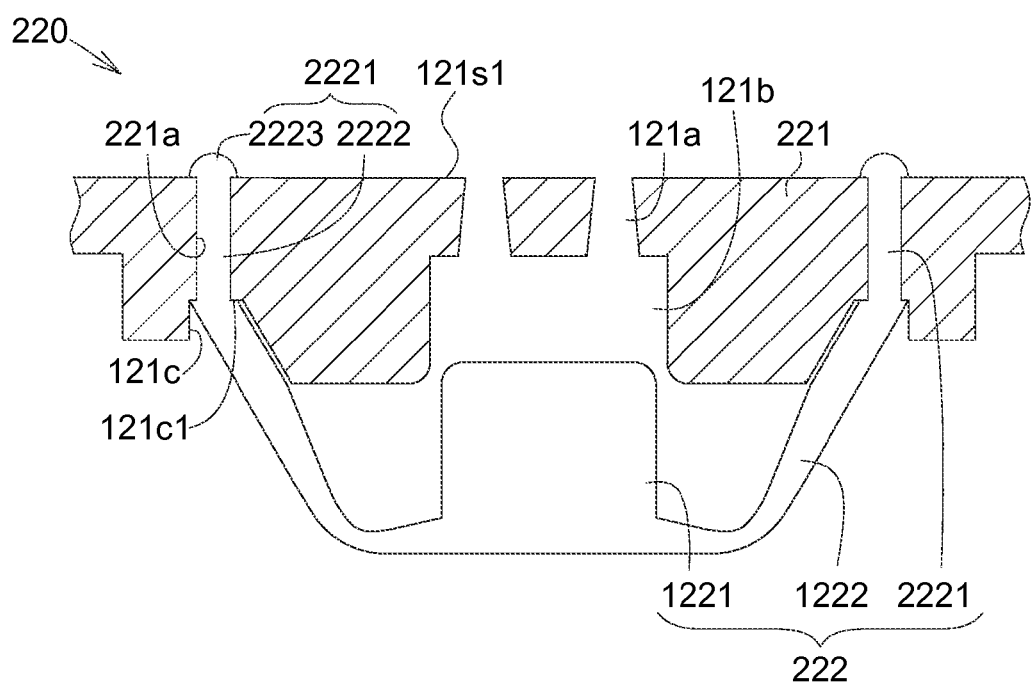
FIG. 5 is a cross-sectional view of a buffer module according to another embodiment of the disclosure.

Referring to FIG. 5, a cross-sectional view of a buffer module according to another embodiment of the disclosure is shown. The buffer module 220 comprises a base 221 and a buffer component 222. In the present embodiment of the disclosure, the buffer component 222 comprises a protrusion 1221, a flexible arm 1222 and a fixing member 2221 disposed on a terminal portion of the flexible arm 1222. The fixing member 2221 may fix the relative position between the buffer component 222 and the base 221. To put it in greater details, the base 221 has an inner surface 121s1, a notch 121c and a via 221a extended to the inner surface 121s1 from a bottom surface 121c1 of the notch 121c. The fixing member 2221 of the buffer component 222 comprises a post 2222 and a pressing portion 2223, wherein the post 2222 passes through via 221a, and the pressing portion 2223 is connected to one terminal of the post 2222 and leans on the inner surface 121s1 of the base 121 for fixing the relative position between the post 2222 and the base 221. An outer diameter of the pressing portion 2223 is larger than an inner diameter of the via 221a, such that the buffer component 222 will not come off the base 221 easily. In an embodiment, the pressing portion 2223 with an outer diameter larger than the post 2222 may be formed by the hot pressing method. With design of the fixing member 2221, the adhesive 123 may be selectively omitted.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A portable electronic device, comprising:
    a casing; and
    a buffer module disposed on the casing, wherein the buffer module comprises:
    a base comprising a gas vent and a buffer recess; and
    a buffer component comprising a protrusion and a flexible arm, wherein the protrusion is slidable relative to the buffer recess, and the flexible arm is connected to the protrusion and has a terminal portion fixed on the base;
    wherein the flexible arm is extended to the base from a lateral surface of the protrusion.

2. The portable electronic device according to claim 1, wherein a first buffer gas chamber is formed between the protrusion and a bottom surface of the buffer recess.

3. The portable electronic device according to claim 1, wherein the gas vent is a conic hole.

4. The portable electronic device according to claim 1, wherein the base has an inner surface, and the gas vent is vertically extended to an inner surface from a bottom surface of the buffer recess.

5. The portable electronic device according to claim 1, wherein the protrusion of the buffer component is moveably disposed in the buffer recess.

6. The portable electronic device according to claim 1, wherein the buffer component has a plurality of the gas vents arranged in the form of an array.

7. The portable electronic device according to claim 1, wherein the flexible arm is extended to an exterior of the protrusion from the lateral surface of the protrusion in a direction towards a notch, so that a second buffer gas chamber is formed between the protrusion and the flexible arm.

8. The portable electronic device according to claim 1, wherein the buffer component further comprises:
    a fixing member fixing a relative position between the buffer component and the base.

* * * * *